(12) United States Patent
Tomlinson et al.

(10) Patent No.: US 10,468,899 B2
(45) Date of Patent: Nov. 5, 2019

(54) BATTERY CHARGER SYSTEM AND METHOD

(71) Applicant: Swanbarton Limited of Barton House, Wiltshire (GB)

(72) Inventors: Clive Tomlinson, Wiltshire (GB); Oliver Shotton, Bristol (GB)

(73) Assignee: Swanbarton Limited of Barton House, Wiltshire (GB)

( * ) Notice: Subject to any disclaimer, the term of this patent is extended or adjusted under 35 U.S.C. 154(b) by 0 days.

(21) Appl. No.: 15/936,867

(22) Filed: Mar. 27, 2018

(65) Prior Publication Data
US 2019/0131796 A1  May 2, 2019

(51) Int. Cl.
*H02J 7/00* (2006.01)
*H02J 7/02* (2016.01)
*G01R 31/392* (2019.01)

(52) U.S. Cl.
CPC ............ *H02J 7/007* (2013.01); *H02J 7/0047* (2013.01); *H02J 7/0077* (2013.01); *H02J 7/02* (2013.01); *G01R 31/392* (2019.01); *H02J 2007/005* (2013.01)

(58) Field of Classification Search
CPC ...................................... H02J 7/007
USPC ......................................................... 320/134
See application file for complete search history.

(56) References Cited

U.S. PATENT DOCUMENTS

| | | | | |
|---|---|---|---|---|
| 6,229,285 B1* | 5/2001 | Ding | ..................... | H01M 10/44 320/132 |
| 6,424,157 B1* | 7/2002 | Gollomp | .............. | G01R 31/006 324/430 |
| 6,653,817 B2* | 11/2003 | Tate, Jr. | ................ | G01R 31/389 320/132 |
| 2006/0091863 A1* | 5/2006 | Melichar | ................ | H02J 7/0047 320/132 |
| 2007/0216367 A1* | 9/2007 | Coleman | .............. | G01R 31/388 320/132 |
| 2014/0247004 A1* | 9/2014 | Kari | ........................ | H02J 5/005 320/106 |

* cited by examiner

*Primary Examiner* — Yalkew Fantu
(74) *Attorney, Agent, or Firm* — Blueshift IP, LLC; Robert Plotkin

(57) ABSTRACT

Battery state of health is a term used to describe the amount by which a battery has degraded since manufacture, and in particular is a measure of the total capacity of the battery relative to its original total capacity. As it can be dangerous to attempt to charge an unhealthy battery, the present invention provides a system and method for determining battery 1 state of health in remote environments where equipment and high-speed data access are limited.

3 Claims, 3 Drawing Sheets

BATTERY CHARGER SYSTEM AND METHOD

The present invention relates generally to a system for charging a battery and a method of monitoring the state of health of a battery and finds particular, although not exclusive, utility with 12V DC car batteries.

Battery state of health is a term used to describe the amount by which a battery has degraded since manufacture, and in particular is a measure of the total capacity of the battery relative to its original total capacity. Various ways of determining battery state of health are known that do not require a battery to be fully charged and then discharged through a known load. However, these methods are not easily conducted in remote environments where equipment and high-speed data access are limited. It can be dangerous to attempt to charge an unhealthy battery, and conventional battery testing equipment is both bulky and costly.

According to a first aspect of the present invention, there is provided a battery charger system configured to monitor the state of health of a battery, the battery charger system comprising: a charger device configured to be connectable to a battery, the charger device having a power source, and the charger device comprising: a microcontroller configured to control operation of the charger device; a DC power supply for supplying direct current to a battery connected to the charger device; at least one voltmeter for determining a potential difference between two terminals; an AC power supply for supplying alternating current to the battery connected to the charger device; and a transceiver for transmitting data signals from the charger device and receiving instruction signals at the charger device; a mobile computing device connected to the charger device, the mobile computing device configured to receive the data signals from the charger device and transmit instruction signals to the charger device, the mobile computing device further configured to communicate over a mobile telecommunication system; and a remote computing device configured to communicate with the mobile computing device over the mobile telecommunication system; wherein the battery charger system is configured to: supply alternating current to the battery with the AC power supply; determine a potential difference between two terminals due to the supplied alternating current with the at least one voltmeter; transmit a data signal indicative of the potential difference determined by the at least one voltmeter to the mobile computing device from the charger device; send a communication based on the data signal indicative of the potential difference determined by the at least one voltmeter to the remote computing device from the mobile computing device over the mobile telecommunication system, in response to the mobile computing device receiving the data signal; determine a state of health of the battery at the mobile computing device from the data signal indicative of the potential difference, or at the remote computing device from the communication based on the data signal indicative of the potential difference; send an instruction communication to the mobile computing device from the remote computing device over the mobile telecommunication system, in response to determining the state of health of the battery and receiving the communication; transmit an instruction signal to the charger device with the mobile computing device, in response to receiving the instruction communication; and supply direct current to the battery with the DC power supply, in response to receiving the instruction signal at the charger device.

In this way, a battery may be tested before charging to ensure that it is safe to charge. In particular, the state of health of the battery may be determined by either the mobile computing device or the remote computing device; however, whichever makes that determination, the remote computing device is required to give permission for the charger device to charge the battery (relayed via the mobile computing device). Specifically, if the mobile computing device makes the determination, the results of that determination are passed to the remote computing device; alternatively, the data signal may be forwarded (in whole or in part) to the remote computing device for determination there.

An indication of the battery state of health may be presented to a user, for instance on the mobile computing device. For instance, the instruction communication may comprise the indication of the battery state of health. The indication may comprise a colour (e.g. red, amber or green), a number (e.g. a percentage), picture (e.g. tick, cross, smile, frown), word, or any other means of conveying information relating to the state of charge. In this way, a user may be able to track declining state of health, and arrange for a replacement battery to be sourced prior to failure of the battery under test.

The battery connected to the charger device may be a battery under test, and/or a battery for charging.

The power source may comprise a mains electricity connection, an electrical generator and/or a power source battery. The power source battery may comprise the battery under test.

The DC power supply may be configured to charge the battery under test. The DC power supply may be separate from the power source, or may be fed from the power source. For instance, the DC power supply may comprise an AC-DC converter, for example to convert mains electricity to DC current. Alternatively or additionally, the DC power supply may comprise the power source battery, and/or be supplied by the power source battery.

The at least one voltmeter may comprise a single voltmeter, at least one voltmeter, two or more voltmeters, only two voltmeters, or any other appropriate number of voltmeters. The at least one voltmeter may comprise an analogue-to-digital convertor, for instance in an integrated circuit, from which the charge device can digitally read a detected voltage.

The two terminals may be fixed, that is to say, the at least one voltmeter may be configured to determine a potential difference between only two specific terminals. Alternatively or additionally, the two terminals may be selected by the microcontroller from a plurality of terminals.

The charger device may be removably connectable to each of a plurality of batteries. The charger device, mobile computing device and/or remote computing device may be configured to record data relating to each of a plurality of batteries, such that a change in battery state of health can be recorded for the plurality of batteries over time. The charger device, mobile computing device and/or remote computing device may be configured to identify each of a plurality of batteries automatically; alternatively, user input may be required to identify each battery.

The at least one voltmeter may be arranged to determine a potential difference between the terminals of the battery. The at least one voltmeter may be arranged to determine a potential difference across a load connected to one and/or both terminals of the battery.

The at least one voltmeter may be configured to determine a static, average and/or DC voltage.

Alternatively or additionally, the at least one voltmeter may be configured to determine an alternating voltage, in particular the peak, peak-to-peak, RMS voltage, and/or to record a trace of the voltage over at least one cycle (and/or an determine an average cycle). The voltmeter may be further configured to determine frequency and/or phase of the alternating voltage, for instance, the voltmeter may determine a phase relative to some predetermined time signal or relative to the phase of the alternating current.

The AC power supply may comprise a DC-AC converter, an oscillator, or some other device for producing an AC signal. The AC current may comprise current having a frequency within a predetermined range, for instance at audio frequencies, between 10 to 30,000 Hz, in particular between 20 to 20,000 Hz, more particularly between 50 and 10,000 Hz.

The AC power supply may be configured to supply alternating current at more than one frequency. The AC power supply may supply alternating current varying in frequency over a range of frequencies. In this way, the response of the battery to different frequencies can be used in determining the state of health of the battery.

The transceiver may be configured to transmitting data signals from the charger device and receiving instruction signals at the charger device wirelessly (e.g. WiFi, Near Field Communication and/or Bluetooth (®)) and/or over a wired connection (e.g. USB or similar).

Communication over a mobile telecommunication system may comprise 2G/second generation wireless mobile telecommunications technology, 3G/third generation wireless mobile telecommunications technology, 4G/fourth generation wireless mobile telecommunications technology, other forms of wireless mobile telecommunications technology and/or SMS/Short-Messaging-Service.

The remote computing device may comprise a server and/or desktop computer, and may be configured to communicate with the mobile computing device over the mobile telecommunication system via the internet.

The remote computing device and/or the mobile device may be configured to determine an impedance of the battery. Thus, the state of health of the battery may be determined by comparing a measured impedance of the battery to a previously measured impedance of the battery; that is, a decrease in the measured impedance of a battery indicates a degradation in the state of health thereof.

The remote computing device and/or the mobile device may store data relating to the battery under test, such that comparisons may be made with earlier tests.

If the state of health of the battery is determined to be below some threshold then the remote computing device may send a signal to the mobile device indicating that the battery should not be recharged and/or should be replaced. If the state of health of the battery is determined to be above some further predetermined threshold (which may be the same as the first predetermined threshold) then the remote computing device may send a signal to the mobile device indicating that the battery is safe to recharge, or that the battery may be recharged. The charger device may be configured to await user input before charging, for instance by receiving a confirmation signal from a user interface device, either as part of the charger device or the mobile computer device.

According to a second aspect of the present invention, there is provided a method of monitoring the state of health of a battery, comprising: providing the battery charger system of the first aspect; supplying alternating current to the battery with the AC power supply; determining a potential difference between two terminals due to the supplied alternating current with the at least one voltmeter; transmitting a data signal indicative of the potential difference determined by the at least one voltmeter to the mobile computing device from the charger device; sending a communication based on the data signal indicative of the potential difference determined by the at least one voltmeter to the remote computing device from the mobile computing device over the mobile telecommunication system, in response to the mobile computing device receiving the data signal; determining a state of health of the battery at the mobile computing device from the data signal indicative of the potential difference, or at the remote computing device from the communication based on the data signal indicative of the potential difference; sending an instruction communication to the mobile computing device from the remote computing device over the mobile telecommunication system, in response to determining the state of health of the battery and receiving the communication; transmitting an instruction signal to the charger device with the mobile computing device, in response to receiving the instruction communication; and supplying direct current to the battery with the DC power supply, in response to receiving the instruction signal at the charger device.

The invention may include a computer processor configured to execute computer program code for carrying out at least one step in the method of the second aspect.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
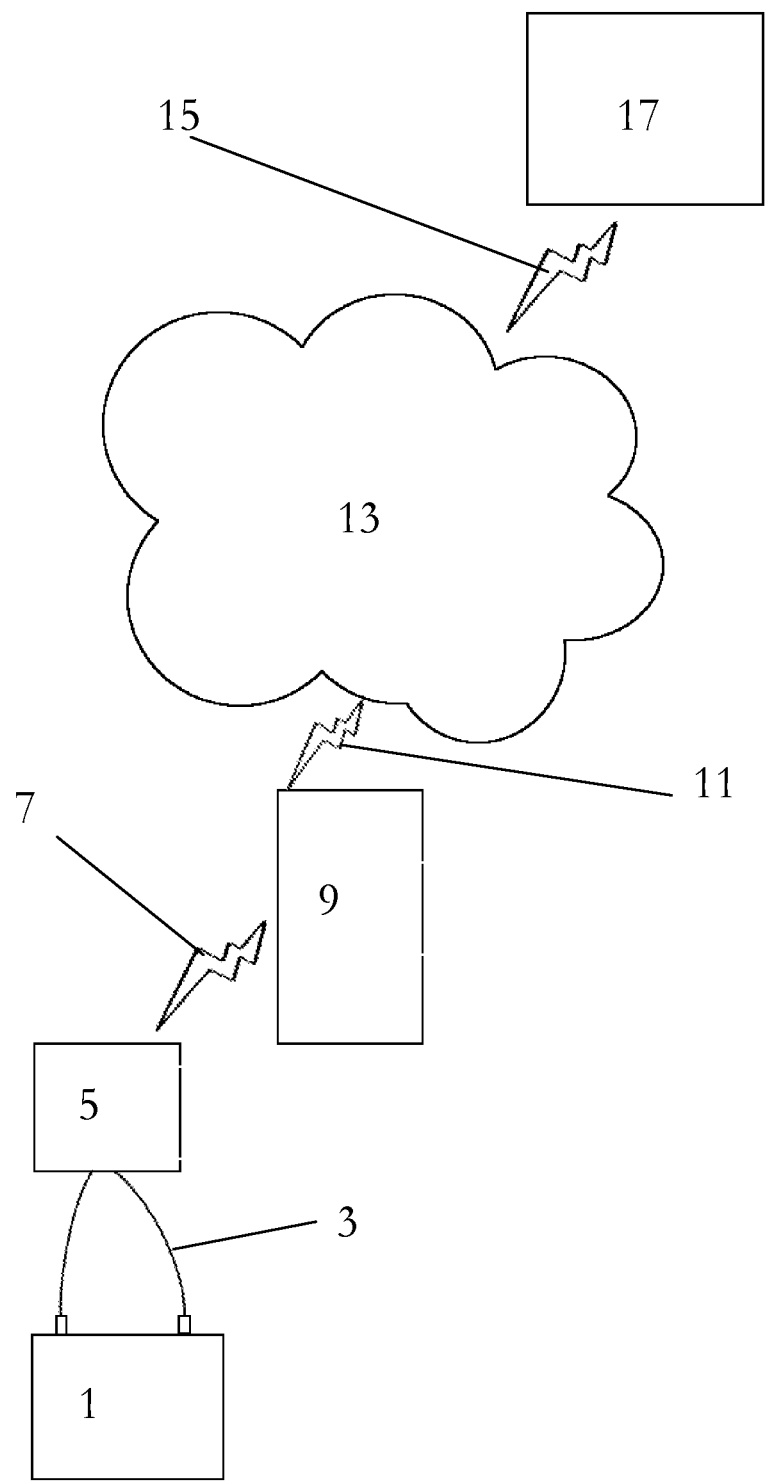
FIG. 1 is a representation of a battery charging system.

The present invention will be described with respect to certain drawings but the invention is not limited thereto but only by the claims. The drawings described are only schematic and are non-limiting. Each drawing may not include all of the features of the invention and therefore should not necessarily be considered to be an embodiment of the invention. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that operation is capable in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that operation is capable in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "connected", used in the description, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other. For instance, wireless connectivity is contemplated.

Reference throughout this specification to "an embodiment" or "an aspect" means that a particular feature, structure or characteristic described in connection with the embodiment or aspect is included in at least one embodiment or aspect of the present invention. Thus, appearances of the phrases "in one embodiment", "in an embodiment", or "in an aspect" in various places throughout this specification are not necessarily all referring to the same embodiment or aspect, but may refer to different embodiments or aspects. Furthermore, the particular features, structures or characteristics of any embodiment or aspect of the invention may be combined in any suitable manner, as would be apparent to one of ordinary skill in the art from this disclosure, in one or more embodiments or aspects.

Similarly, it should be appreciated that in the description various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Moreover, the description of any individual drawing or aspect should not necessarily be considered to be an embodiment of the invention. Rather, as the following claims reflect, inventive aspects lie in fewer than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some features included in other embodiments, combinations of features of different embodiments are meant to be within the scope of the invention, and form yet further embodiments, as will be understood by those skilled in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

In the discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

The use of the term "at least one" may mean only one in certain circumstances. The use of the term "any" may mean "all" and/or "each" in certain circumstances.

The principles of the invention will now be described by a detailed description of at least one drawing relating to exemplary features of the invention. It is clear that other arrangements can be configured according to the knowledge of persons skilled in the art without departing from the underlying concept or technical teaching of the invention, the invention being limited only by the terms of the appended claims.

FIG. 1 is a representation of a battery charging system comprising a battery 1 to be charged, connected by electrical wires 3 to a charger device 5. The charger device 5 is capable of wireless communication 7 with a mobile device 9, such as a smartphone, tablet, phablet, laptop, etc. In alternative arrangements the communication 7 may be wired, rather than wireless.

The mobile device 9 is configured to communicate over the wireless telecommunication network 11, and thence via the internet 13 to a network-enabled 15 remote computer 17.

The charger device 5 is configured to carry out the charging and testing operations; however, intensive data processing may be carried out by the remote computer 17, which may include processing of data relating to multiple batteries which may have been relayed by a plurality of mobile computing devices. Communication between the charger device 5 and the remote computer 17 is mediated by the mobile device 9, which may communicate either wired or wirelessly (e.g. WiFi, Blue Tooth (®) or Near Field Communication) 7 with the charger device 5 and wirelessly 11 with the internet 13.

Figure 2:
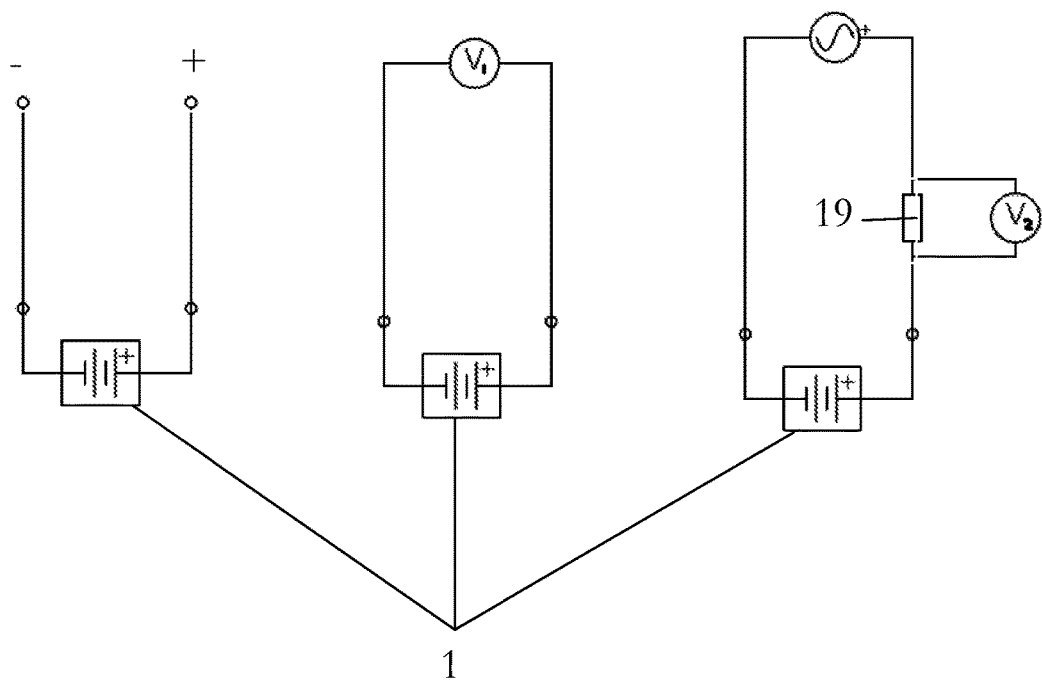
FIG. 2 is a circuit diagram demonstrating the different modes of operation of a charger device.

FIG. 2 is a circuit diagram demonstrating the different modes of operation of a charger device. The left diagram shows positive (+) and (−) terminals arranged to charge the battery 1. The middle diagram shows a first voltmeter V1 arranged to measure the voltage across the battery 1. The right diagram shows an alternating current being applied through the battery 1 in series with a resistor 19; a second voltmeter V2 measures the voltage over the resistor 19. As the resistance of resistor 19 is known, the impedance of the battery can be calculated from the measured voltage amplitude and phase relationship to the applied alternating current.

Figure 3:
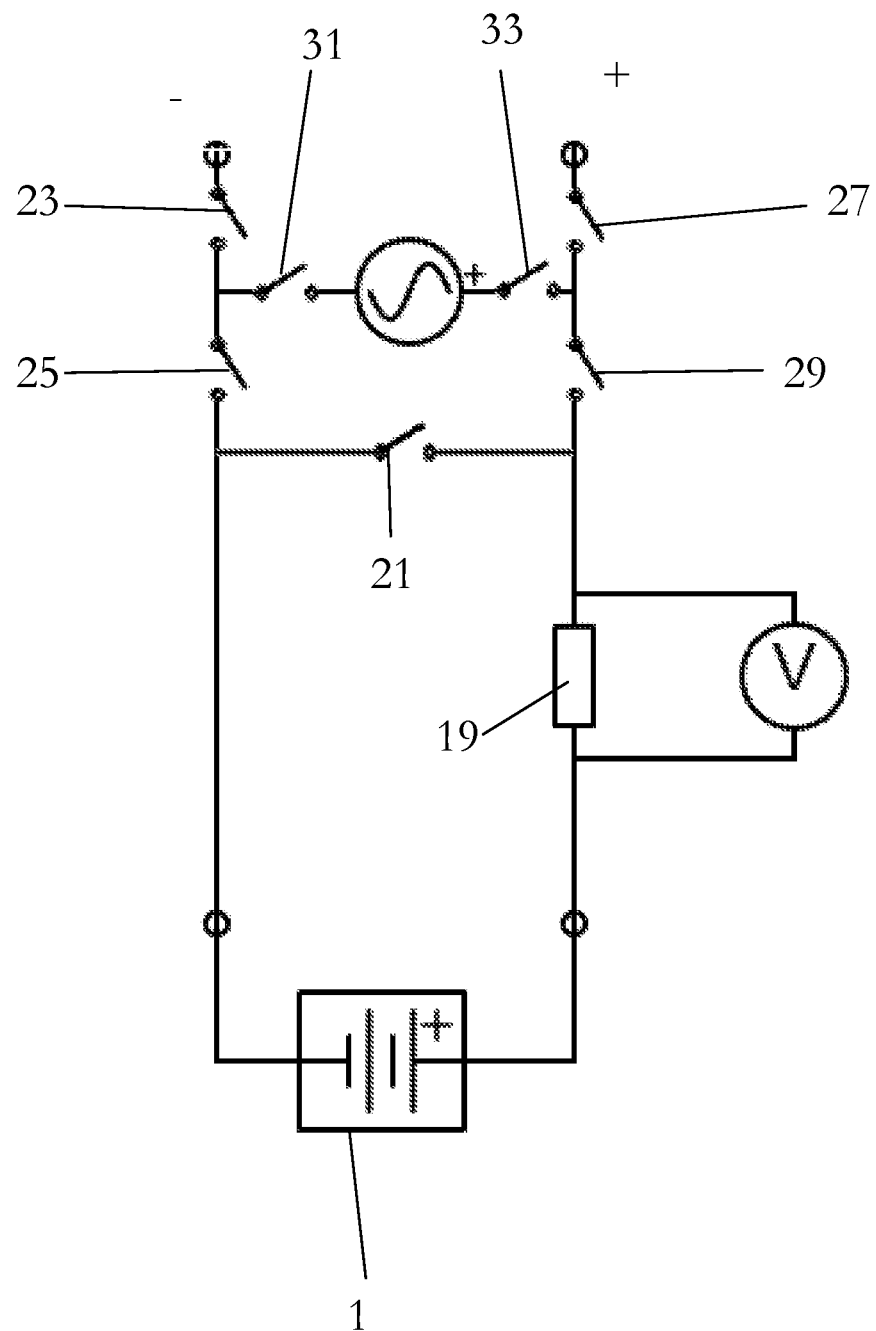
FIG. 3 is a circuit diagram showing one possible arrangement of components within the charger device.

FIG. 3 is a circuit diagram showing one possible arrangement of components within the charger device in which a single voltmeter V is used.

When the switch 21 is closed, and switches 25 and 29 are left open, the voltage of the battery can be determined by the voltmeter V.

When switch 21 is open, and switches 23, 25, 27 and 29 are closed, the battery can be charged by the positive (+) and negative (−) terminals.

When the switch 21, 23 and 27 are open, and switches 25, 31, 33 and 29 are closed, then an alternating current signal is passed through the battery 1 and the alternating voltage across the resistor 19 can be measured and compared to the alternating current.

In alternative arrangements, relays may be used in place of the switches referred to above.

The invention claimed is:

1. A battery charger system configured to monitor a state of health of a battery, the battery charger system comprising:
   a charger device configured to be connectable to the battery, the charger device having a power source, and the charger device comprising:
      a microcontroller configured to control operation of the charger device;
      a DC power supply for supplying direct current to the battery connected to the charger device;
      at least one voltmeter for determining a potential difference between two terminals;
      an AC power supply for supplying alternating current to the battery connected to the charger device; and
      a transceiver for transmitting data signals from the charger device and receiving instruction signals at the charger device;
   a mobile computing device connected to the charger device, the mobile computing device configured to receive the data signals from the charger device and transmit instruction signals to the charger device, the mobile computing device further configured to communicate over a mobile telecommunication system; and
   a remote computing device configured to communicate with the mobile computing device over the mobile telecommunication system;
   wherein the battery charger system is configured to:
      supply alternating current to the battery with the AC power supply;
      determine a potential difference between two terminals due to the supplied alternating current with the at least one voltmeter;
      transmit a data signal indicative of the potential difference determined by the at least one voltmeter to the mobile computing device from the charger device;
      send a communication based on the data signal indicative of the potential difference determined by the at least one voltmeter to the remote computing device from the mobile computing device over the mobile telecommunication system, in response to the mobile computing device receiving the data signal;
      determine a state of health of the battery at the mobile computing device from the data signal indicative of the potential difference, or at the remote computing device from the communication based on the data signal indicative of the potential difference;
      send an instruction communication to the mobile computing device from the remote computing device over the mobile telecommunication system, in response to determining the state of health of the battery and receiving the communication;
      transmit an instruction signal to the charger device with the mobile computing device, in response to receiving the instruction communication; and
      supply direct current to the battery with the DC power supply, in response to receiving the instruction signal at the charger device.

2. The battery charger system of claim 1, wherein the AC power supply is configured to supply alternating current at more than one frequency.

3. A method of monitoring the state of health of a battery, comprising:
   providing the battery charger system of claim 1;
   supplying alternating current to the battery with the AC power supply;
   determining a potential difference between two terminals due to the supplied alternating current with the at least one voltmeter;
   transmitting a data signal indicative of the potential difference determined by the at least one voltmeter to the mobile computing device from the charger device;
   sending a communication based on the data signal indicative of the potential difference determined by the at least one voltmeter to the remote computing device from the mobile computing device over the mobile telecommunication system, in response to the mobile computing device receiving the data signal;
   determining a state of health of the battery at the mobile computing device from the data signal indicative of the potential difference, or at the remote computing device from the communication based on the data signal indicative of the potential difference;
   sending an instruction communication to the mobile computing device from the remote computing device over the mobile telecommunication system, in response to determining the state of health of the battery and receiving the communication;
   transmitting an instruction signal to the charger device with the mobile computing device, in response to receiving the instruction communication; and
   supplying direct current to the battery with the DC power supply, in response to receiving the instruction signal at the charger device.

* * * * *